(12) United States Patent
Hsieh et al.

(10) Patent No.: US 9,775,262 B1
(45) Date of Patent: Sep. 26, 2017

(54) SECURITY BEZEL FOR RACK MOUNTABLE SERVER

(71) Applicant: DELL PRODUCTS, LP, Round Rock, TX (US)

(72) Inventors: Po-Li (Nelson) Hsieh, Taoyuan (TW); Chuan Chieh (Dennis) Tseng, Taipei (TW)

(73) Assignee: DELL PRODUCTS, LP, Round Rock, TX (US)

( * ) Notice: Subject to any disclaimer, the term of this patent is extended or adjusted under 35 U.S.C. 154(b) by 0 days.

(21) Appl. No.: 15/079,501

(22) Filed: Mar. 24, 2016

(51) Int. Cl.
*H05K 7/16* (2006.01)
*E05B 73/00* (2006.01)
*H05K 7/14* (2006.01)

(52) U.S. Cl.
CPC ........... *H05K 7/1489* (2013.01); *E05B 73/00* (2013.01)

(58) Field of Classification Search
CPC .. H05K 7/1489; H05K 7/1487; H05K 7/1488; E05B 73/00; E05B 73/0082
USPC ............ 361/679.02, 724–727, 679.57; 70/58
See application file for complete search history.

(56) References Cited

U.S. PATENT DOCUMENTS

| | | | |
|---|---|---|---|
| 5,691,879 A * | 11/1997 | Lopez | E05B 63/143 312/219 |
| 6,134,115 A | 10/2000 | Sim et al. | |
| 6,134,116 A | 10/2000 | Hoss et al. | |
| 6,295,204 B1 * | 9/2001 | Gibbons | E05B 73/0082 361/679.57 |
| 6,494,070 B1 | 12/2002 | Moss et al. | |
| 6,557,385 B1 * | 5/2003 | Shih | H05K 5/0208 16/366 |
| 7,054,144 B2 | 5/2006 | Heistand, II et al. | |
| 7,151,666 B2 * | 12/2006 | Song | H05K 7/1487 312/223.2 |
| D580,444 S | 11/2008 | Dearborn et al. | |
| D588,137 S | 3/2009 | Lawrence et al. | |
| 7,617,706 B1 * | 11/2009 | Kuo | E05B 65/46 292/182 |
| D664,959 S | 8/2012 | Terwilliger et al. | |
| D739,409 S | 9/2015 | Terwilliger et al. | |
| 2003/0002261 A1 * | 1/2003 | Berry | H05K 7/1489 361/727 |
| 2004/0233619 A1 | 11/2004 | Heistand, II et al. | |
| 2004/0264146 A1 * | 12/2004 | Kerrigan | H05K 7/1489 361/726 |
| 2005/0122702 A1 * | 6/2005 | Chen | H05K 7/1487 361/797 |
| 2011/0249393 A1 | 10/2011 | Mi et al. | |
| 2016/0029509 A1 * | 1/2016 | House | H04Q 1/14 361/679.01 |
| 2016/0209868 A1 * | 7/2016 | Hartman | G06F 1/16 |

* cited by examiner

*Primary Examiner* — Nidhi Thaker
(74) *Attorney, Agent, or Firm* — Larson Newman, LLP (57) ABSTRACT

A security bezel for a server such as a rack mounted server includes a triggered securing mechanism at one end of the security bezel. The securing mechanism includes a trigger that when actuated, causes securing members deploy from the securing mechanism to engage corresponding recesses in the server, thereby attaching the security bezel to the server. The deployed securing members may be locked in position, thereby locking the security bezel to the server. The security bezel may be unlocked, allowing for retraction of the securing members to an undeployed state and detachment of the security bezel from a server.

16 Claims, 13 Drawing Sheets

SECURITY BEZEL FOR RACK MOUNTABLE SERVER

FIELD OF THE DISCLOSURE

The present disclosure generally relates to information handling systems, and more particularly relates to a security bezel for a rack mountable server.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A security bezel for an information handling system such as a server includes a securing mechanism. The securing mechanism includes a trigger that when actuated causes securing members to deploy from the securing mechanism to engage corresponding recesses in the server, thereby attaching the security bezel to the server. The security bezel may be locked to lock the deployed securing members in deployed position, thereby locking the security bezel to the server. The security bezel may be unlocked, allowing for retraction of the securing members to an undeployed state and detachment of the security bezel from a server.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

In embodiments, an information handling system may be a server. One example of a server is a rack mountable server which may be mounted in a server rack having the ability to hold, for example, shelve, multiple servers. A rack mountable server may have many components and it may be desirable to control access to the internals of a rack mountable server and components thereof. To this end, a detachable security bezel may be mounted on an external face of a rack mountable server to prevent access to one or more components of the server so that said components may not be tampered with or removed. Also, the detachable security bezel may prevent the rack mountable server to which it is attached from being tampered with or having settings changed. To this end, a security bezel may have a locking function which locks the security bezel to the server such that the bezel protecting or providing security to the server may not be removed without actuating the locking function.

Figure 1:
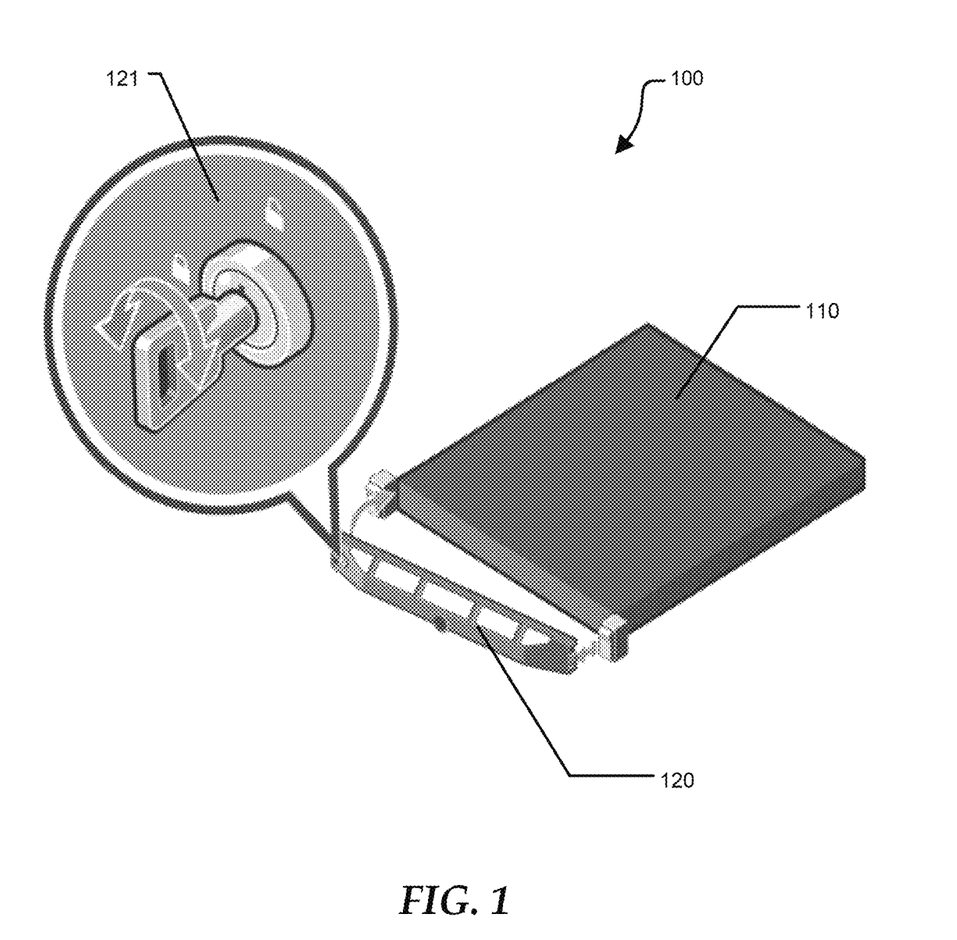
FIG. 1 illustrates a rack mountable server system, according to an embodiment of the present disclosure.

FIG. 1 illustrates a rack mountable server system 100 comprising a rack mountable server 110 and a security bezel 120 for rack mountable server 110. As shown in FIG. 1, security bezel 120 may be detachably attached to a portion, as shown, a face or plane, for example the front face, of server 110 to secure that portion of server 110. Security bezel 120 may include a locking element 121 which may be actuated to lock security bezel 120 to be attached to server 110 such that security bezel 120 may not be detached from server 110 without actuating locking element 121 to be in an unlocked state. As shown in FIG. 1, locking element 121 may be a key-actuated locking device.

Figure 2:
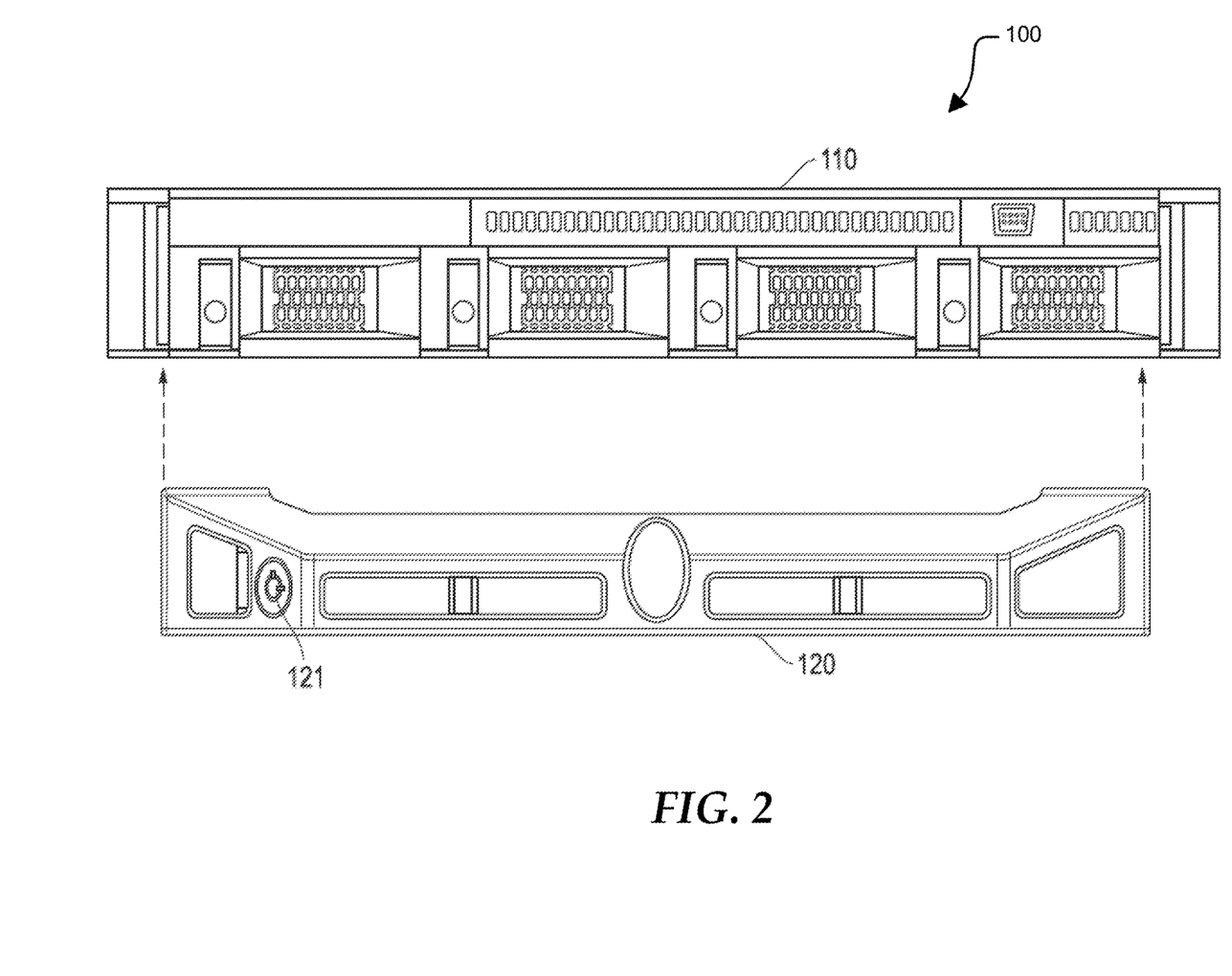
FIG. 2 illustrates a rack mountable server system, according to an embodiment of the present disclosure.

FIG. 2 further illustrates a rack mountable server system 100 comprising a rack mountable server 110 and a security bezel 120 for rack mountable server 110. FIG. 2 provides a frontal view of server 110 and security bezel 120. As can be seen from FIG. 2, security bezel 120 includes a locking element 121, which, as shown in FIG. 2, may be key-actuated. Security bezel 120 may be attached to server 110 to provide security to server 110.

Figure 3A:
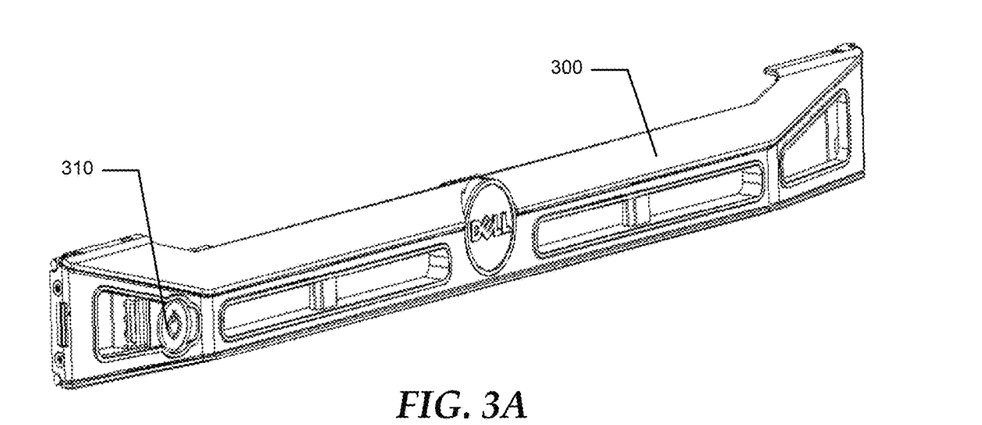
FIGS. 3A-3C illustrate a security bezel for a server, according to an embodiment of the present disclosure.
Figure 3B:
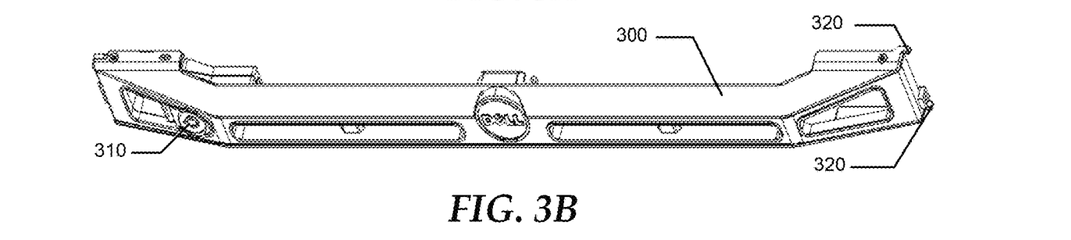
Figure 3C:
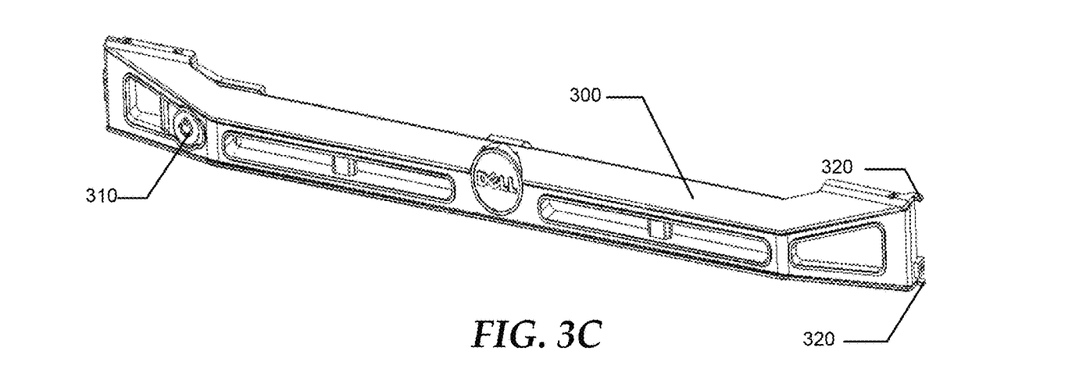

FIGS. 3A-3C illustrate a security bezel 300. Security bezel 300 detachably attaches to the front face of a server, such as a rack mountable server, and may be similar to security bezel 120 of FIGS. 1 and 2. As shown in FIGS. 3A-3C, security bezel 300 includes locking element 310 which may be used to lock security bezel 300 to a face of a server, for example, the front face, such that security bezel 300 may not be detached from the server without actuating locking element 310 to unlock locking element 310. FIGS. 3B and 3C further illustrate attachment members 320 which may fit into corresponding recesses in a server to partially attach security bezel 300 to the server.

Figure 4:
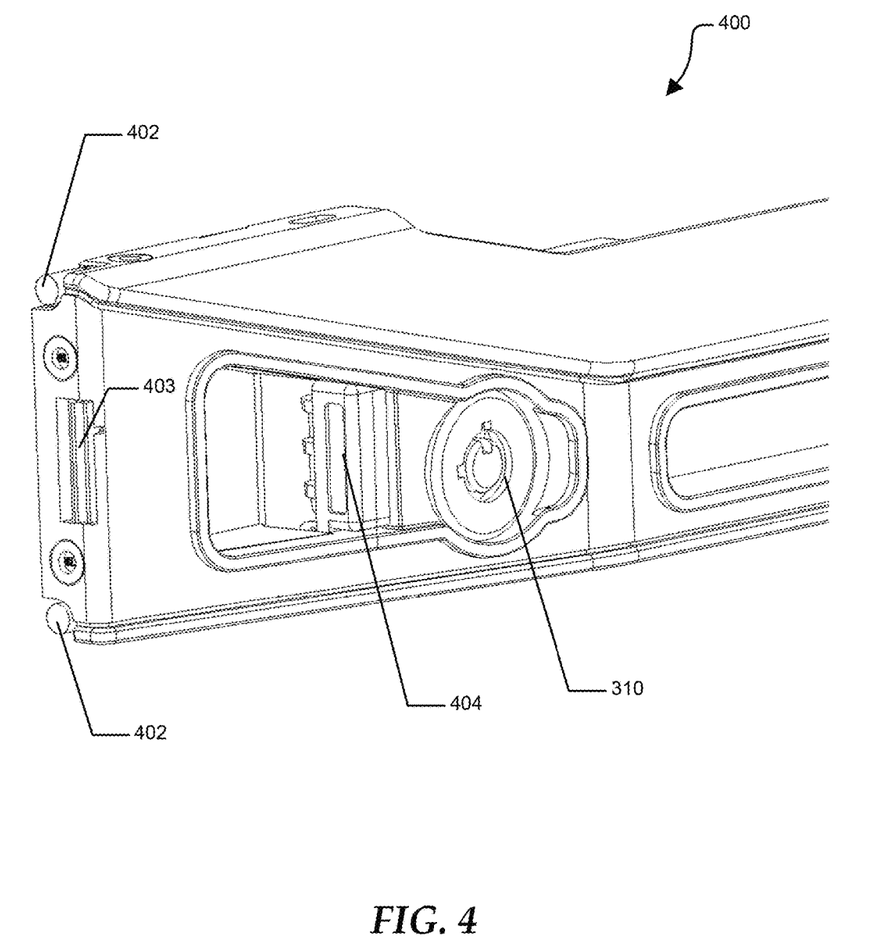
FIG. 4 illustrates a portion of a security bezel for a server, according to an embodiment of the present disclosure.

FIG. 4 illustrates a portion 400 of security bezel 300. Portion 400 includes locking element 310. As shown in portion 400, security bezel 300 includes securing members 402, trigger member 403, and retraction button 404. Securing members 402 may be deployed to fit into corresponding recesses in a server to securely attach security bezel 300 to the server. Actuation of trigger member 403 triggers deployment of securing members 402, which deploy and fit into corresponding recesses in a server, thus securely attaching security bezel 300 to a server. In one embodiment, securing members 402 are spring-tensioned such that actuation of trigger member 403 allows for the spring tension on securing members 402 to cause deployment of securing members 402. In one embodiment, trigger member 403 is actuated by contact with a corresponding portion of the server. Retraction button 404 may be actuated to return securing members 402 to an undeployed state, thus allowing an attached security bezel to be detached from a server. Locking element 310 may be actuated, for example, by a key, to prevent retraction button 404 from being actuated, thereby locking an attached security bezel to a server face.

Figure 5:
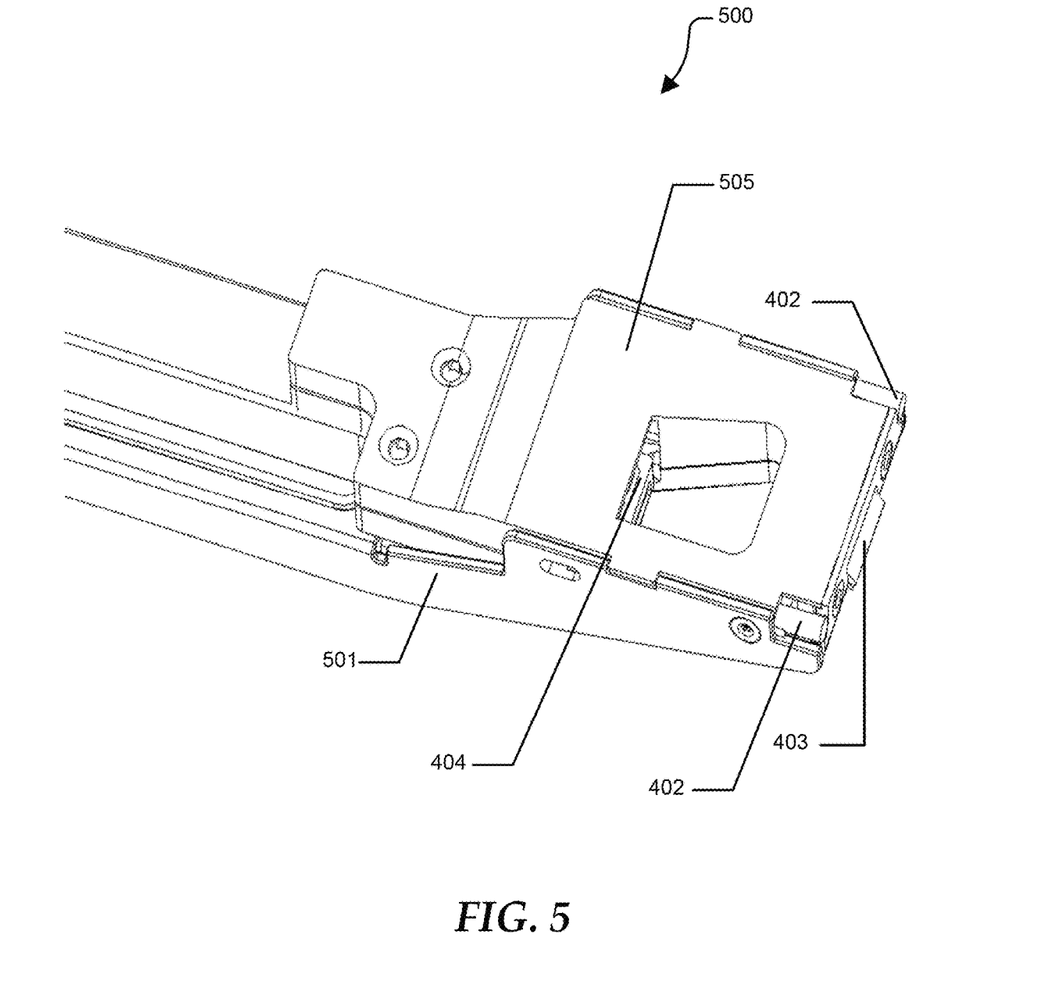
FIG. 5 illustrates a portion of a security bezel for a server, according to an embodiment of the present disclosure.

FIG. 5 illustrates a securing mechanism portion 500 of security bezel 300. Securing mechanism portion 500 is defined by body 501 and cover 505. As shown in portion 500, security bezel 300 includes securing members 402, trigger member 403, and retraction button 404. In embodiments, cover 505 may be removable.

Figure 6:
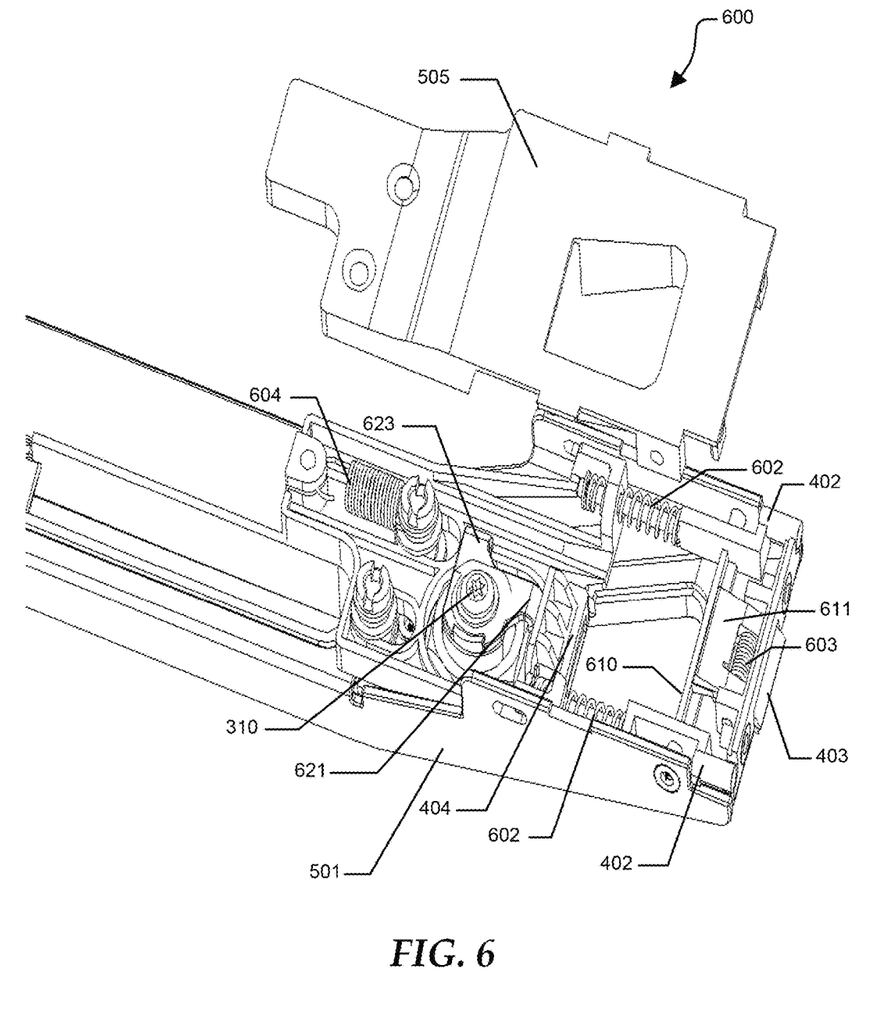
FIG. 6 illustrates a securing mechanism portion of a security bezel for a server, according to an embodiment of the present disclosure.

FIG. 6 illustrates a securing mechanism portion 600 of security bezel 300. As shown in securing mechanism portion 600, cover 505 has been removed to provide a view of an embodiment of a securing mechanism of security bezel 300 within securing mechanism portion 600. Locking element 310, securing members 402, trigger member 403, and retraction button 404 may be seen in portion 600. As further shown in portion 600, security bezel 300 includes deployment springs 602, trigger spring 603, retraction spring 604, transfer bar 610, and trigger latch 611. As further shown in portion 600, locking element 310 of security bezel 300 comprises locking arm 621 and unlocking arm 623.

Deployment springs 602 are coupled to their respective securing members 402 to provide a spring force on securing members 402. Trigger spring 603 is coupled to trigger member 403 to provide a spring force on trigger member 403. As further shown in FIG. 6, securing members 402 are positioned in parallel and are coupled together in parallel by transfer bar 610. A recess, shelf, groove, channel, or wall in transfer bar 610 engages trigger latch 611. More particularly, a face of transfer bar 610 engages a face of trigger latch 611 when securing members 402 are in the undeployed state, as shown in FIG. 6.

Trigger member 403 is coupled to trigger latch 611, and the spring force of trigger spring 603 tensions trigger member 403 in the unactuated position, as shown in FIG. 6. When trigger member 403 is in the unactuated state, as shown in FIG. 6, coupled trigger latch 611 is engaged with transfer bar 610, more particularly, a face of trigger latch 611 abuts a face of transfer bar 610, as discussed above. This engagement of transfer bar 610 with trigger latch 611 prevents deployment of securing members 402 due to tension from deployment springs 602 because transfer bar 610 is coupled to securing members 402 and the engagement of trigger latch 611 with transfer bar 610 holds transfer bar 610, and thus securing members 402 (which are physically coupled to transfer bar 610 as illustrated), in the undeployed position, as illustrated in FIG. 6.

As can be further seen from FIG. 6, retraction button 404 is physically coupled to the parallel positioned securing members 402, such that actuation of retraction button 404 causes retraction of securing members 402 into the undeployed state. Retraction button 404 may be locked in unactuated position by locking element 310. More particularly, locking element 310 comprises locking arm 621 and unlocking arm 623. Locking element 310 may be actuated, for example, by rotating an element of locking element 310, to bring locking arm 621 to bear against a back face of retraction button 404 to prevent displacement and thus actuation of retraction button 404, thereby locking retraction button 404 is a non-actuated position (shown).

In the alternative, locking element 310 may be actuated, for example, by rotating an element of locking element 310, to move locking arm 621 out of the way of retraction button 404, allowing displacement and thus actuation of retraction button 404, thereby unlocking retraction button 404 (not shown) to allow retraction button to retract securing members 402 into the undeployed state. For example, locking element 310 may be actuated, for example, by rotating an element of locking element 310, to move unlocking arm 623 into position behind retraction button 404. As can be seen from FIG. 6, unlocking arm 623 is shorter than locking arm 621, allowing for displacement, and thus actuation of retraction button 404. Retraction button 404 is tensioned into an unactuated state by tension force of retraction spring 604.

Figure 7:
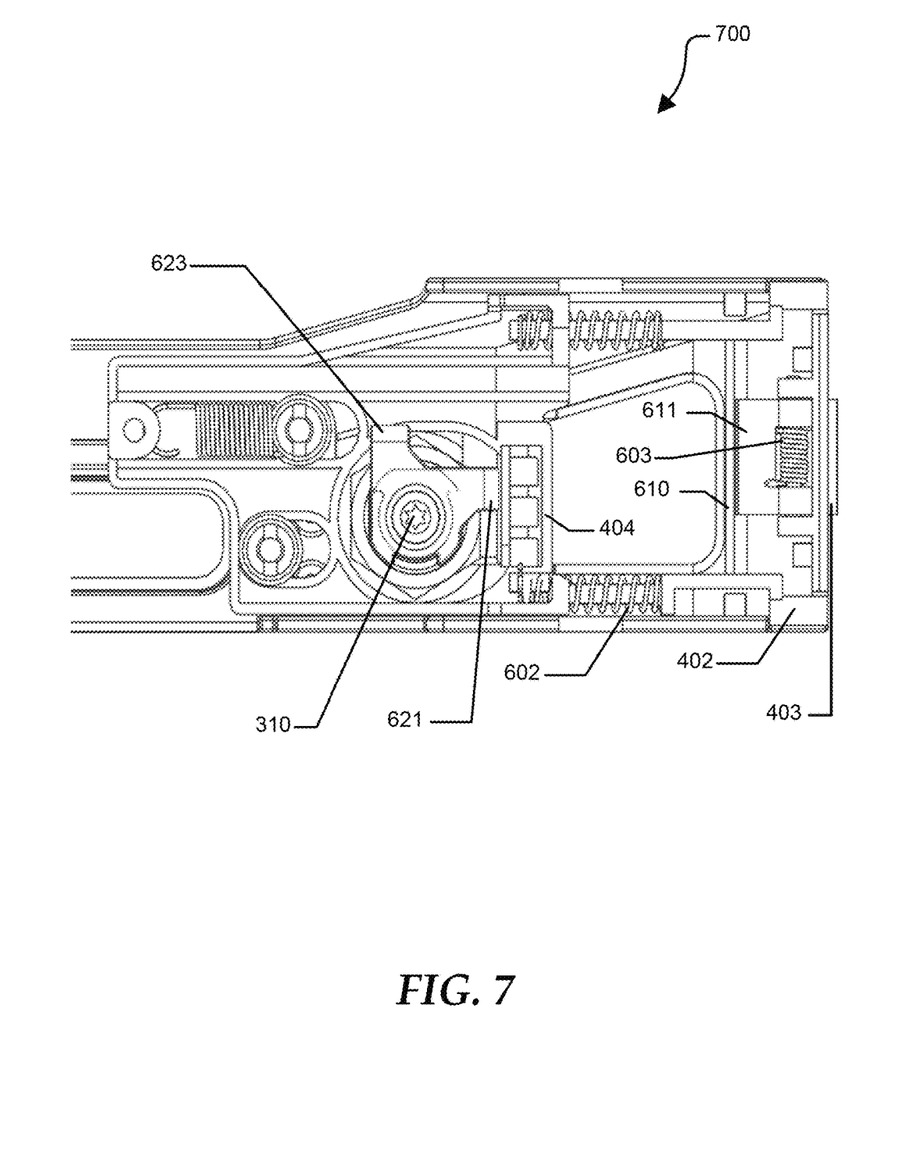
FIG. 7 illustrates a securing mechanism portion of a security bezel for a server, according to an embodiment of the present disclosure.

FIG. 7 illustrates a securing mechanism portion 700 of security bezel 300. Securing mechanism portion 700 provides a view of a securing mechanism of an embodiment of security bezel 300 within securing mechanism portion 700. Securing mechanism portion 700 illustrates parallel securing members 402 under tension from respective deployment springs 602. Securing mechanism portion 700 illustrates transfer bar 610 coupling securing members 402 in parallel. Transfer bar 610 is in engagement with trigger latch 611, thereby holding securing members 402 in the undeployed position as shown. Portion 700 illustrates spring tension of trigger spring 603 tensioning trigger member 403 in the unactuated position and the coupling between trigger member 403 and trigger latch 611. In embodiments, trigger member 403 and trigger latch 611 may be a unitary trigger element and may rotate about an axis.

Securing mechanism portion 700 further illustrates locking element 310 locking retraction button 404 in the unactuated position via locking arms. More particularly, as illustrated in FIG. 7, locking arm 621 is relatively longer than unlocking arm 623 such that when an element of locking mechanism 310 is rotated such that locking mechanism 310 is in the locked state, a face of locking arm 621 is brought to abut a back portion or face of retraction button 404, as shown, preventing a (relative) displacement and thus actuation of retraction button 404.

Figure 8:
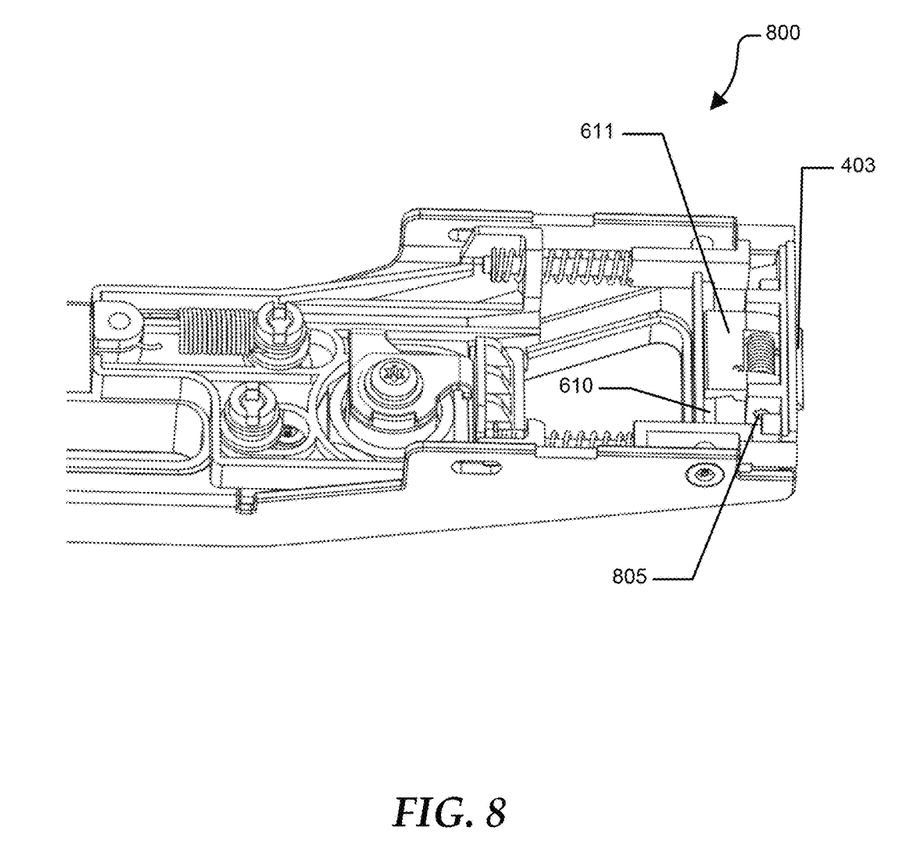
FIG. 8 illustrates a securing mechanism portion of a security bezel for a server, according to an embodiment of the present disclosure.

FIG. 8 illustrates a securing mechanism portion 800 of security bezel 300. Securing mechanism portion 800 provides a view of a securing mechanism of an embodiment of security bezel 300 within securing mechanism portion 800. Securing mechanism portion 800 illustrates transfer bar 610 may provide a ledge which is engagement with a portion, such as a face, of trigger latch 611 when the securing members are undeployed. Securing mechanism portion 800 further illustrates trigger member 403 and trigger latch 611 may be a unitary trigger element and (this trigger element) may rotate about an axis provided by pin 805.

Figure 9:
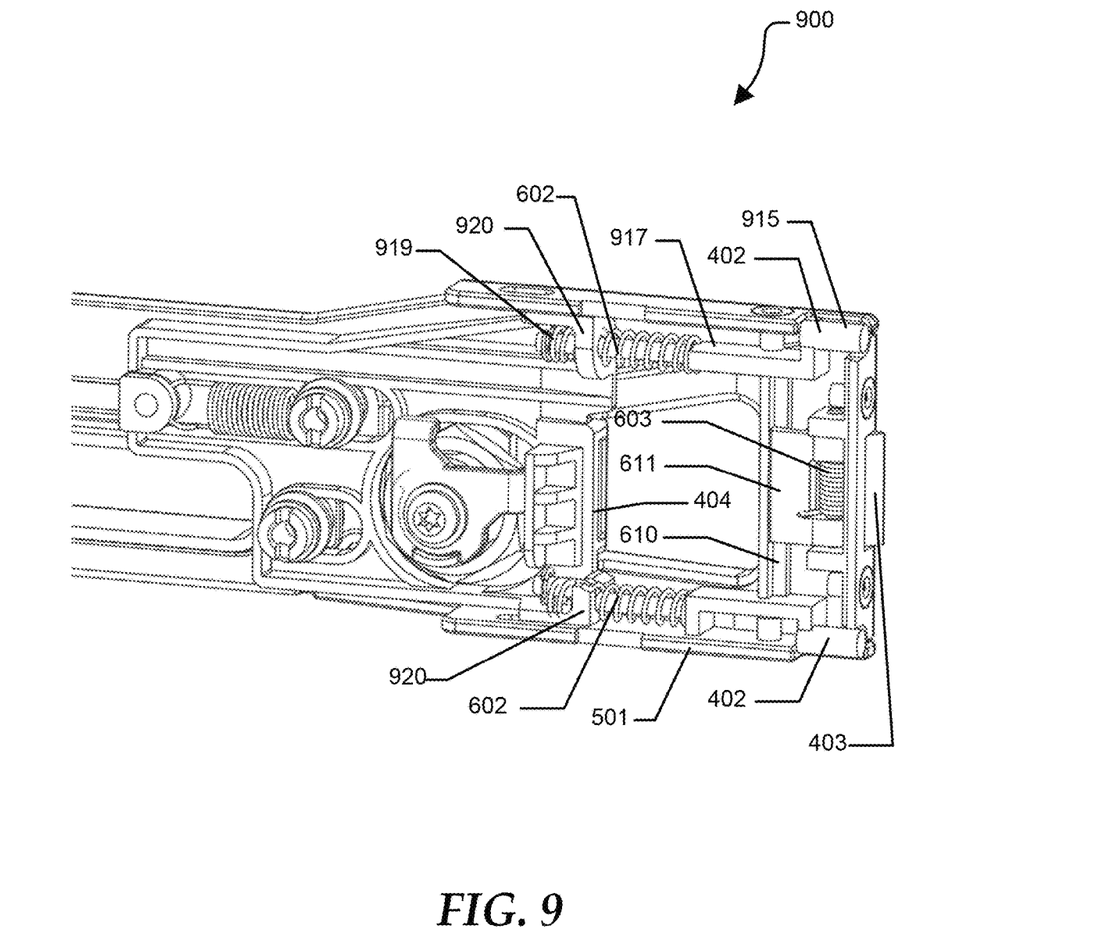
FIG. 9 illustrates a securing mechanism portion of a security bezel for a server, according to an embodiment of the present disclosure.

FIG. 9 illustrates a securing mechanism portion 900 of security bezel 300. Securing mechanism portion 900 provides a view of a securing mechanism of an embodiment of security bezel 300 within securing mechanism portion 900. Securing mechanism portion 900 illustrates securing members 402 being coupled in parallel by transfer bar 610 and the deployment force provided by the tension of the respective deployment spring 602. Securing mechanism portion 900 further illustrates transfer bar 610 may provide a ledge which engages trigger latch 611 to hold securing members 402 in the undeployed state until actuation of trigger member 403 disengages trigger latch 611 from transfer bar 610.

As shown in the embodiment illustrated in FIG. 9, a securing member 402 has a distal end 915, a body 917, and a proximal end 919. When securing member 402 is deployed, a portion of distal end 915 extends beyond housing 501 (not shown) to engage a corresponding recess in a server to secure the security bezel to the server. As shown, distal end 915 may have a circular cross section and be in the shape of a pin. Deployment spring 602 may be positioned around a portion of body 917, and may extend to proximal end 919.

A retraction engagement element 920 may be configured to engage proximal end 919 to return, for example retract, securing member 402 to an undeployed position or state (as shown in FIG. 9, securing member 402 is in the undeployed position or state). Retraction engagement element 920 may be physically coupled to retraction button 404 such that actuation of retraction button 404 causes retraction engagement element 920 to engage proximal end 919 of securing member 402 when securing member 402 is in the deployed state (not shown) to retract securing member 402.

Figure 10A:
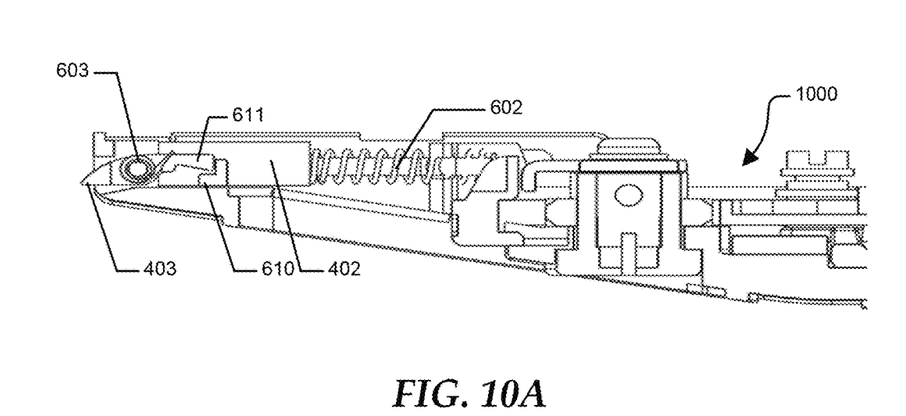
FIGS. 10A-10C illustrate operation of a security bezel for a server, according to an embodiment of the present disclosure.
Figure 10B:
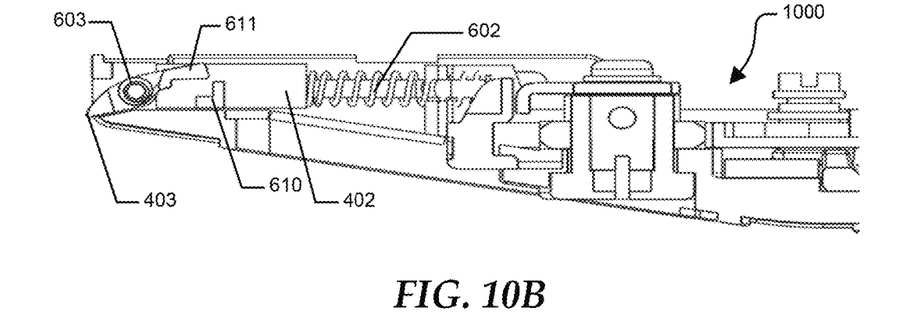
Figure 10C:
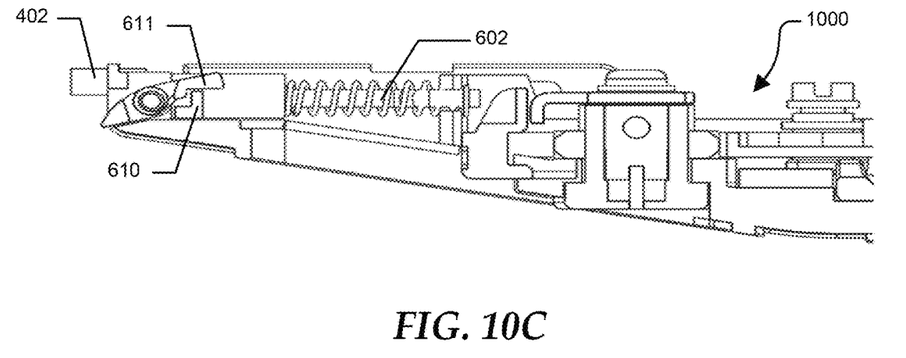

FIGS. 10A-10C illustrates a securing mechanism portion 1000 of security bezel 300. More particularly, FIGS. 10A-10C illustrate deployment of securing members 402 to attach security bezel 300 to a server. In FIG. 10A, securing members 402 are undeployed. As can be seen in FIG. 10A, deployment spring 602 provides a deployment force on securing member 402, but securing member 402 is held in the undeployed state by the engagement of trigger latch 611 with transfer bar 610, which is mechanically coupled to securing member 402. FIG. 10A. further illustrates how trigger latch 611 and trigger member 403 may form a unitary trigger element tensioned into engagement with transfer bar 610 by trigger spring 603.

FIG. 10B illustrates actuation of trigger member 403. As can be seen in FIG. 10B, actuation of trigger member 403 against the spring force of trigger spring 603 disengages trigger latch 611 from transfer bar 610, allowing the tension force provided by deployment spring 602 to deploy securing member 402 (not shown in FIG. 10B).

FIG. 10C illustrates portion 1000 of security bezel 300 when securing member 402 is deployed. As can be seen from FIG. 10C, trigger latch 611 is disengaged from transfer bar 610 and as a consequence, the tension force provided by deployment spring 602 on securing member 402 has caused deployment of securing member 402. The distal end of deployed securing member 602 extends outward to engage a corresponding recess in the corresponding server to securely attach the security bezel to the server.

Figure 11:
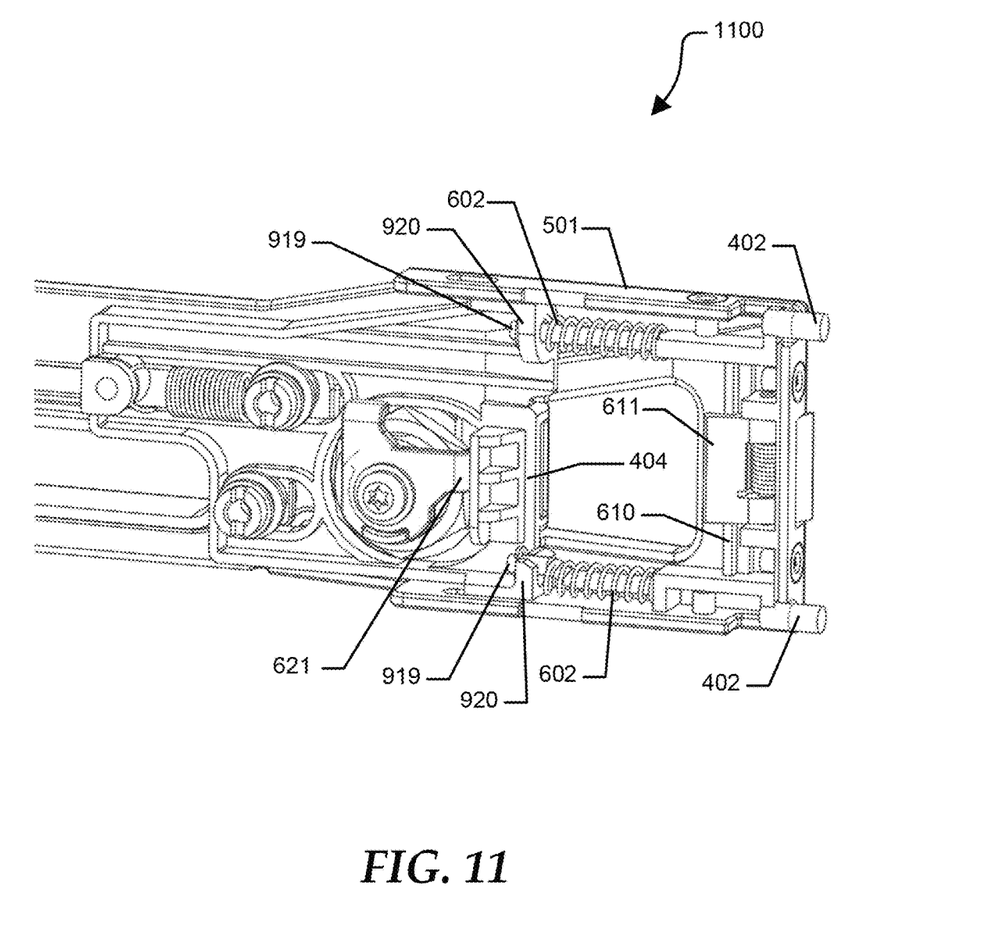
FIG. 11 illustrates a securing mechanism portion of a security bezel for a server, according to an embodiment of the present disclosure.

FIG. 11 illustrates a securing mechanism portion 1100 of security bezel 300. Securing mechanism portion 1100 provides a view of a securing mechanism of an embodiment of security bezel 300 within securing mechanism portion 1100. Securing mechanism portion 1100 illustrates securing members 402 in a deployed state. As can be seen from FIG. 11, the spring tension force provided by deployment springs 602 has forced securing members 402 into the deployed state such that the distal ends of securing member 402 extend beyond housing 501 to engage corresponding recesses of a server to securely attach security bezel 300 to a server. As can further be seen from FIG. 11, trigger latch 611 is disengaged from transfer bar 610, allowing for the deployment of securing members 402 as shown.

As further shown in FIG. 11, retraction engagement element 920 is positioned to engage proximal end 919 of securing member 402 such that actuation of retraction button 404 will cause retraction engagement elements 920 to return securing members 402 to the undeployed position. However, as shown, retraction button 404 cannot be actuated from its relative position due to the blocking position of locking arm 621.

Figure 12:
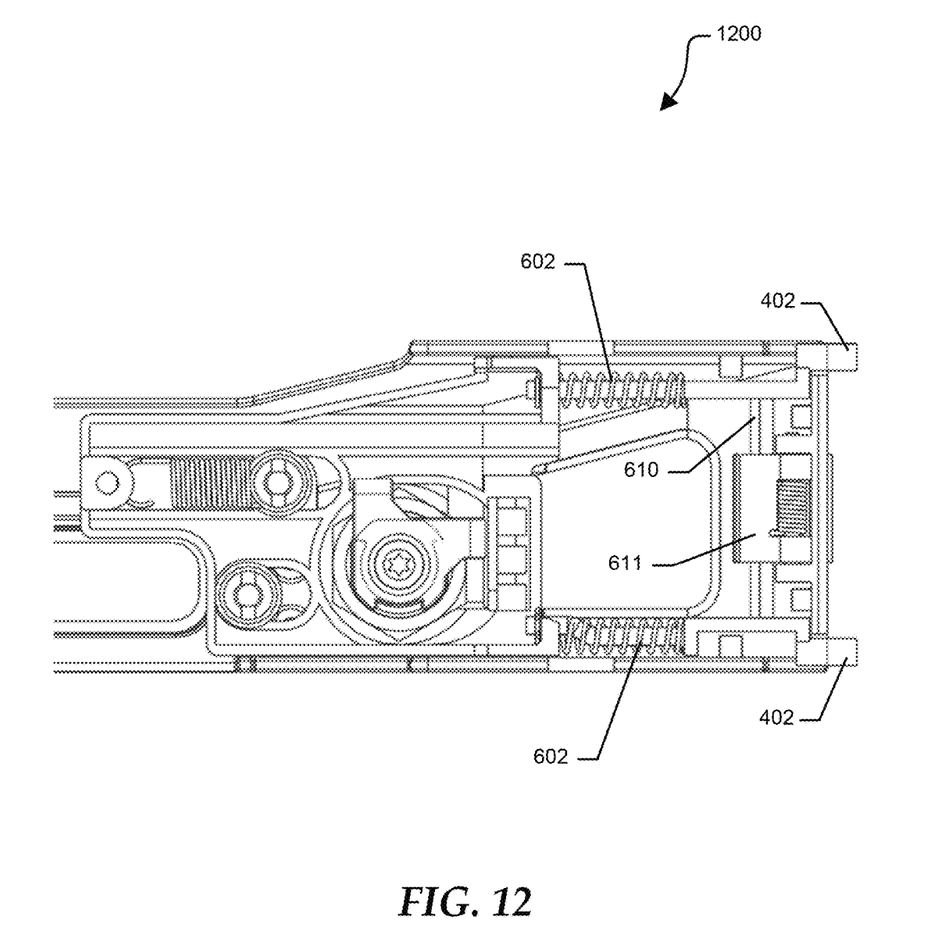
FIG. 12 illustrates a securing mechanism portion of a security bezel for a server, according to an embodiment of the present disclosure.

FIG. 12 illustrates a securing mechanism portion 1200 of security bezel 300. Securing mechanism portion 1200 provides a view of a securing mechanism of an embodiment of security bezel 300 within securing mechanism portion 1200. Securing mechanism portion 1200 illustrates securing members 402 in a deployed state. As can be seen from FIG. 12, the spring tension force provided by deployment springs 602 has forced securing members 402 into the deployed state. As can further be seen from FIG. 12, trigger latch 611 is disengaged from transfer bar 610, allowing for the deployment of securing members 402 as shown.

Figure 13:
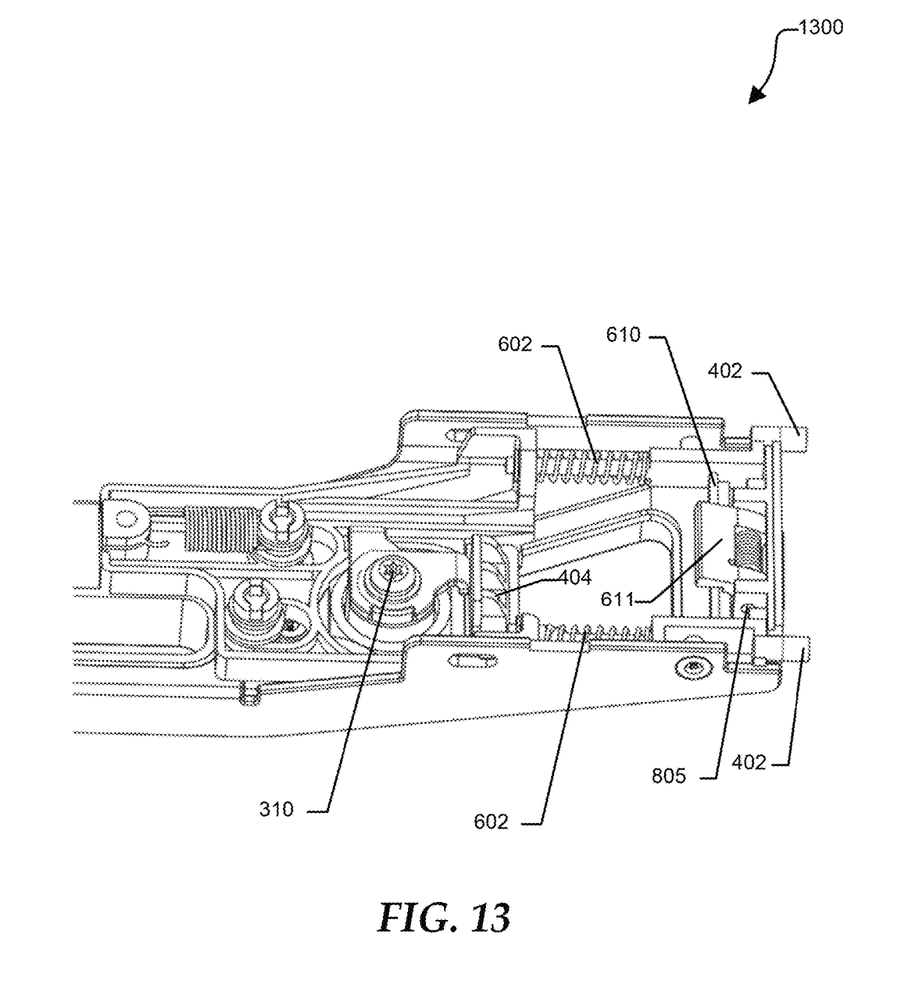
FIG. 13 illustrates a securing mechanism portion of a security bezel for a server, according to an embodiment of the present disclosure.

FIG. 13 illustrates a securing mechanism portion 1300 of security bezel 300. Securing mechanism portion 1300 provides a view of an embodiment of security bezel 300 within securing mechanism portion 1300. Securing mechanism portion 1300 illustrates securing members 402 in a deployed state. As can further be seen from FIG. 13, trigger latch 611 is disengaged from transfer bar 610, allowing for the deployment of securing members 402 as shown due to the spring force of deployment springs 602. Trigger latch 611 may rotate around an axis provided by pin 805 to disengage transfer bar 610. FIG. 13 further illustrates locking element 310 locking retraction button 404 in relative position to prevent retraction button 404 from being actuated to retract securing members 402. Retraction button 404 is mechanically coupled to securing members 402 such that actuation of retraction button 404, for example, by pressing, retracts securing members 402 into the undeployed state. However, as shown, a portion of locking arm 621 abuts the back portion of retraction button 404, preventing actuation of retraction button to retract securing members 402.

While in the above description, deployment springs 602, trigger spring 603, and retraction spring 604 have been shown and described as coil springs, this is by way of example, not limitation, and other types and configurations of springs may be used to provide the described spring forces or tensions. For example, flat or v springs may be used. Further, while the above describes a pair of securing members positioned in parallel and coupled by a transfer bar, in alternative embodiments, there may be only a single securing member to be deployed. Furthermore, while deployment springs 602 are illustrated as being positioned around a portion of the securing members 402, this is by way of example, and deployment springs may have different configurations. Similarly, the attachment configuration of springs illustrated in the figures is by way of example, and other attachment configurations may be utilized.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A security bezel for a server, the security bezel comprising:
    a housing; and
    a securing mechanism coupled to the housing, the securing mechanism including:
        a trigger member;
        a pair of securing members positioned in parallel and configured to transition from an undeployed position relative to the housing to a deployed position relative to the housing when the trigger member is actuated;
        a transfer bar coupling the pair of securing member in parallel; and
        a deployment spring coupled to the pair of securing members and configured to provide a deployment force on the pair of securing members to force the securing members to the deployed position in response to an actuation of the trigger member.

2. The security bezel of claim 1, wherein the trigger member is part of a trigger element, and a portion of the trigger element is configured to engage the transfer bar.

3. The security bezel of claim 2, wherein the securing mechanism further comprises a retraction button, wherein actuation of the retraction button retracts the securing members to the undeployed position.

4. The security bezel of claim 3, wherein the securing mechanism further comprises a retraction engagement element coupled to the retraction button and configured to engage a distal end of a securing member of the pair of securing members.

5. The security bezel of claim 4, wherein the securing mechanism further comprises a locking element, wherein when the locking element is locked, the retraction button is blocked from actuation.

6. The security bezel of claim 5, wherein the locking element comprises a locking arm which, when the locking element is locked, blocks displacement of the retraction button.

7. The security bezel of claim 6, wherein the securing mechanism further comprises a trigger spring configured to provide a tension force on the trigger element to tension the trigger member in an unactuated position.

8. The security bezel of claim 7, wherein the trigger element rotates around an axis due to actuation of the trigger member.

9. A security bezel for a server, the security bezel comprising:
    a housing; and
    a securing mechanism coupled to the housing, the securing mechanism including:
        a trigger element with a trigger member extruding from the securing mechanism when the trigger member is in an unactuated state;
        a first securing member configured to transition from an undeployed position relative to the housing to a deployed position relative to the housing when the trigger member is actuated; and
        a second securing member configured to transition from the undeployed position relative to the housing to the deployed position relative to the housing when the trigger member is actuated, wherein the second securing member is positioned in parallel with the first securing member relative to the securing mechanism;
        a transfer bar coupling the first and second securing members in parallel and configured to engage a trigger latch of the trigger element when the first and second securing members are in the undeployed position;
        a first deployment spring coupled to the first securing member and configured to provide a deployment force on the first securing member;
        a second deployment spring coupled to the second securing member and configured to provide a deployment force on the second securing member; and
        a trigger spring configured to provide a tension force on the trigger element to tension the trigger member in an unactuated position.

10. The security bezel of claim 9, wherein the trigger element rotates around an axis to disengage the trigger latch from the transfer bar due to actuation of the trigger member.

11. The security bezel of claim 10, wherein the securing mechanism further comprises a retraction button, wherein actuation of the retraction button retracts the first and second securing members to the undeployed position.

12. The security bezel of claim 11, wherein the securing mechanism further comprises a first retraction engagement element coupled to the retraction button and configured to engage a distal end of the first securing member.

13. The security bezel of claim 12, wherein the securing mechanism further comprises a locking element, wherein when the locking element is locked, the retraction button is blocked from actuation.

14. The security bezel of claim 13, wherein the locking element comprises a locking arm which, when the locking element is locked, blocks displacement of the retraction button.

15. A security bezel for a server, the security bezel comprising:
    a housing; and
    a securing mechanism coupled to the housing, the securing mechanism including:
        a trigger element with a trigger member extruding from the securing mechanism when the trigger member is in an unactuated state, wherein the trigger member is actuated by mechanical engagement with the server;

a first securing member configured to transition from an undeployed position relative to the housing to a deployed position relative to the housing when the trigger member is actuated;

a first deployment spring coupled to the first securing member and configured to provide a deployment force on the first securing member;

a second securing member configured to transition from the undeployed position relative to the housing to the deployed position relative to the housing when the trigger member is actuated, wherein the second securing member is positioned in parallel with the first securing member relative to the securing mechanism;

a transfer bar coupling the first and second securing members in parallel and configured to engage a trigger latch of the trigger element when the first and second securing members are in the undeployed position;

a second deployment spring coupled to the second securing member and configured to provide a deployment force on the second securing member;

a retraction button, wherein actuation of the retraction button retracts the first and second securing members to the undeployed position; and a locking element distinct from the trigger element and trigger member, wherein when the locking element is locked, the retraction button is blocked from actuation.

16. The security bezel of claim 15, wherein the securing mechanism further comprises a first retraction engagement element coupled to the retraction button and configured to engage a distal end of the first securing member, and wherein the locking element comprises a locking arm which, when the locking element is locked, blocks displacement of the retraction button.

* * * * *